(12) United States Patent
Watanabe (10) Patent No.: US 9,064,802 B2
(45) Date of Patent: Jun. 23, 2015

(54) METHOD OF MANUFACTURING SEMICONDUCTOR DEVICE AND SEMICONDUCTOR DEVICE HAVING OXIDE FILM CRYSTALLIZED BY A THERMAL TREATMENT

(75) Inventor: Yukimune Watanabe, Chino (JP)

(73) Assignee: SEIKO EPSON CORPORATION (JP)

( * ) Notice: Subject to any disclaimer, the term of this patent is extended or adjusted under 35 U.S.C. 154(b) by 877 days.

(21) Appl. No.: 12/113,350

(22) Filed: May 1, 2008

(65) Prior Publication Data

US 2008/0303119 A1  Dec. 11, 2008

(30) Foreign Application Priority Data

Jun. 8, 2007  (JP) .................................. 2007-152566

(51) Int. Cl.
*H01L 29/51* (2006.01)
*H01L 21/28* (2006.01)

(52) U.S. Cl.
CPC ..... *H01L 21/28176* (2013.01); *H01L 21/28088* (2013.01); *H01L 21/28194* (2013.01); *H01L 29/517* (2013.01)

(58) Field of Classification Search
CPC ............ H01L 21/28176; H01L 29/517; H01L 21/28088; H01L 21/28194
USPC ........... 257/632, E21.192, E29.162; 438/591, 438/585
See application file for complete search history.

(56) References Cited

U.S. PATENT DOCUMENTS

| | | | |
|---|---|---|---|
| 6,593,229 B1 * | 7/2003 | Yamamoto et al. ............ | 438/635 |
| 6,921,711 B2 * | 7/2005 | Cabral et al. .................. | 438/589 |
| 7,030,450 B2 | 4/2006 | Lee et al. | |
| 7,033,888 B2 * | 4/2006 | Pan et al. ....................... | 438/257 |
| 7,399,716 B2 | 7/2008 | Lee et al. | |
| 7,521,325 B2 | 4/2009 | Sakoda et al. | |
| 2003/0001477 A1 * | 1/2003 | Sasaguri ......................... | 313/310 |
| 2005/0087870 A1 * | 4/2005 | Adetutu et al. ................. | 257/751 |
| 2005/0272206 A1 * | 12/2005 | Forbes ........................... | 438/257 |
| 2006/0081939 A1 * | 4/2006 | Akasaka et al. ................ | 257/371 |
| 2006/0118891 A1 * | 6/2006 | Lee et al. ....................... | 257/410 |
| 2006/0166425 A1 * | 7/2006 | Triyoso et al. ................. | 438/199 |
| 2008/0227250 A1 * | 9/2008 | Ranade et al. ................. | 438/203 |

FOREIGN PATENT DOCUMENTS

| | | |
|---|---|---|
| JP | 2004-104111 | 4/2004 |
| JP | 2006-041306 | 2/2006 |

(Continued)

OTHER PUBLICATIONS

D. H. Triyoso et al., "ZrO2 addition and capping layer studies to improve HfO2 film quality," Austin Silicon Technology Solutions,(2004), p. 4.*

(Continued)

*Primary Examiner* — Mohammad Islam
*Assistant Examiner* — John P Dulka
(74) *Attorney, Agent, or Firm* — Harness, Dickey & Pierce, P.L.C.

(57) ABSTRACT

A method of manufacturing a semiconductor device includes forming a metal oxide on a semiconductor substrate, forming a gate electrode film on the metal oxide, and executing a thermal treatment on the semiconductor substrate provided with the metal oxide and the gate electrode film to crystallize the metal oxide.

14 Claims, 8 Drawing Sheets

(56) References Cited

FOREIGN PATENT DOCUMENTS

| JP | 2006-086151 | 3/2006 |
|---|---|---|
| JP | 2006-278488 | 10/2006 |

OTHER PUBLICATIONS

D. H. Triyoso et al., "Impact of Zr addition on properties of atomic layer deposited HfO2," Appl. Phys. Lett. 88, 222901 (2006), p. 222901-1222901-3.*

K. Kita et al., "Permittivity Increase of Yttrium-Doped HfO2v through structural phase transformation," Applied Physics Letter 86, (2005), p. 102906-1-102906-3.*

K. Tomida et al., "Dielectric Constant Enhancement Due to Si Incorporation into HfO2," Applied Physics Letters 89, (2006), p. 142902-1 to 142902-3.*

Tomida, Kazuyuki et al.; Dielectric constant enhancement due to Si incorporation into HfO2; Applied Physics Letters vol. 89, Published 2006, pp. 142902-1 to 142902-3.*

S. Kremmer, et al., "Nanoscale Morphological and Electrical Homogeneity of $HfO_2$ and $ZrO_2$ Thin Films Studied by Conducting Atomic-Force Microscopy," Journal of Applied Physics 97, pp. 074315-1 to 074315-7 (2005).

K. Kita, et al., "Permittivity Increase of Yttrium-Doped $HfO_2$ Through Structural Phase Transformation," Applied Physics Letter 86, pp. 102906-1 to 102906-3 (2005).

K. Tomida, et al., "Dielectric Constant Enhancement Due to Si Incorporation into $HfO_2$," Applied Physics Letter 89, pp. 142902-1 to 142902-3 (2006).

D. H. Triyoso, et al., "$ZrO_2$ Addition and Capping Layer Studies to Improve $HfO_2$ Film Quality," Austin Silicon Technology Solutions, p. 4 (2006).

G. D. Wilk et al., "Correlation of Annealing Effects on Local Electronic Structure and Macroscopic Electrical Properties for HfO2 Deposited by Atomic Layer Deposition", Applied Physics Letters, Nov. 10, 2003, vol. 83, No. 19, pp. 3984-3986.

* cited by examiner

METHOD OF MANUFACTURING SEMICONDUCTOR DEVICE AND SEMICONDUCTOR DEVICE HAVING OXIDE FILM CRYSTALLIZED BY A THERMAL TREATMENT

The entire disclosure of Japanese Patent Application No. 2007-152566, filed Jun. 8, 2007 is expressly incorporated by reference herein.

BACKGROUND

1. Technical Field

Several aspects of the present invention relate to a method of manufacturing a semiconductor device and a semiconductor device, and in particular to a technology for forming a metal oxide having a cubic, tetragonal, or orthorhombic crystal structure.

2. Related Art

Reduction of device size is effective for improving performance of existing MOS transistors, and therefore, reduction of gate insulating film thickness as well as reduction of gate length has been promoted. However, the silicon oxide film, which has been used as the gate insulating film in the past, has reached a limit of thickness, and it has been getting difficult to prevent the leakage current from the gate electrode. In order for solving this problem, a gate insulating film material with high permittivity has been getting necessary, and as such a material, hafnium oxide such as $HfSiO_x$ or $HfAlO_x$ is now under review.

Incidentally, hafnium oxide easily crystallizes at relatively low temperature, and therefore, in the form of a thin film, there are pointed the problems of surface roughness caused by crystal grains and increase in the leakage current flowing through the boundary of the crystal grains (see e.g., S. Kremmer, et al., J. Appl. Phys. 97, 074315 (2005)).

Further, hafnium oxide has a permittivity varying depending on the crystal structure, and generally forms a monoclinic crystal structure having a low permittivity by a thermal treatment. In contrast, there is a case of realizing a cubic or tetragonal crystal structure having a high permittivity by mixing zirconium (Zr), yttrium (Y), silicon (Si), or the like with hafnium oxide (see e.g., K. Kita, et al., Appl. Phys. Lett. 86, 102906 (2005), K. Tomida, et al., Appl. Phys. Lett. 89, 142902 (2006), D. H. Triyoso, et al., SISC, P-4 (2006)). Further, there is a case of eliminating voids in the hafnium oxide by executing an annealing treatment on the hafnium oxide covered with a TiN film, thereby improving the flatness thereof (see e.g., D. Triyoso, et al., SISC, P-4 (2006)).

However, in these technologies known to the public, it is required to mix the elements (hereinafter also referred to as impurities) other than hafnium oxide such as Zr, Y, or Si for obtaining the hafnium oxide with a cubic, tetragonal, or orthorhombic crystal structure, and there has never been a technology capable of forming the hafnium oxide with a cubic, tetragonal, or orthorhombic crystal structure without mixing the impurities.

SUMMARY

In consideration of the circumstance described above, the invention has an advantage of providing a method of manufacturing a semiconductor device capable of forming a hafnium oxide with a cubic, tetragonal, or orthorhombic crystal structure without mixing the impurities, and the semiconductor device thus manufactured.

A method of manufacturing a semiconductor device according to a first aspect of the invention includes the steps of forming a metal oxide on a semiconductor substrate, forming a gate electrode film on the metal oxide, and executing a thermal treatment on the semiconductor substrate provided with the metal oxide and the gate electrode film to crystallize the metal oxide.

A method of manufacturing a semiconductor device according to a second aspect of the invention includes the steps of forming a metal oxide on a semiconductor substrate, forming a first gate electrode film on the metal oxide, forming a second electrode film on the first electrode film, and executing a thermal treatment on the semiconductor substrate provided with the metal oxide and the first and second gate electrode films to crystallize the metal oxide.

A method of manufacturing a semiconductor device according to a third aspect of the invention includes the steps of forming a metal oxide on a semiconductor substrate, forming a protective film on the metal oxide, and executing a thermal treatment on the semiconductor substrate provided with the metal oxide and the protective film to crystallize the metal oxide.

In the method of manufacturing a semiconductor device of the third aspect of the invention, the protective film may include a first protective film and a second protective film, and the step of forming the protective film may include the steps of forming the first protective film on the metal oxide, and forming the second protective film on the first protective film.

The method of manufacturing a semiconductor device of the third aspect of the invention may further include the steps of removing the protective film from above the metal oxide crystallized in the thermal treatment, and forming a gate electrode film on the metal oxide from which the protective film is removed.

In the method of manufacturing a semiconductor device of the third aspect of the invention, the gate electrode film may include a first gate electrode film and a second electrode film, the step of forming the gate electrode film may include the steps of forming the first gate electrode film on the metal oxide from which the protective film is removed, and forming the second gate electrode film on the first gate electrode film.

A method of manufacturing a semiconductor device according to a fourth aspect of the invention includes the steps of forming a metal oxide on a semiconductor substrate, forming a first protective film on the metal oxide, forming a second protective film on the first protective film, executing a thermal treatment on the semiconductor substrate provided with the metal oxide and the first and second protective films to crystallize the metal oxide, removing the second protective film from above the first protective film on the metal oxide crystallized in the thermal treatment, and forming a third gate electrode film on the first protective film from which the second protective film is removed, and, the first protective film is made of a gate electrode film material.

In the method of manufacturing a semiconductor device of the fourth aspect of the invention, the metal oxide may be a hafnium oxide film.

In the method of manufacturing a semiconductor device of the fourth aspect of the invention, the gate electrode film may be a film formed of one of a silicon film, a silicide film, a metal nitride film, a metal carbide film, and a metal itself.

In the method of manufacturing a semiconductor device of the fourth aspect of the invention, the first gate electrode film may be formed of one of a metal nitride, a metal carbide, and a metal itself, and the second gate electrode film may be one of a silicon film and a silicide film.

In the method of manufacturing a semiconductor device of the fourth aspect of the invention, temperature of the thermal treatment may be in a range from 400° C. to 1000° C. Here, the temperature of 400° C. is a temperature at which the $HfO_2$ film starts crystallizing. Further, as shown in the results of the experiments described later, although the monoclinic crystal structure starts appearing in the $HfO_2$ in a temperature range of 900° C. through 1000° C. to decrease the permittivity, the principal part of the crystal structure is still cubic even at temperature of 1000° C.

According to the method of manufacturing a semiconductor device of above aspects of the invention, the metal oxide having a cubic, tetragonal, or orthorhombic crystal structure can be obtained, and the metal oxide having a high permittivity and small leakage current can be used as the gate insulating film. Therefore, further reduction of the thickness of the gate insulating film becomes possible. Further, the metal oxide with a cubic or tetragonal crystal structure can stably be formed with or without doping of, for example, Zr (Hf), Si, Y, Sc, Ti, Ta, Mg, Ca, Ba, or lanthanoid into the metal oxide.

A semiconductor device according to a fifth aspect of the invention includes a semiconductor substrate, a metal oxide formed on the semiconductor substrate, and a gate electrode film formed on the metal oxide, the metal oxide has one of a cubic crystal structure, a tetragonal crystal structure, and an orthorhombic crystal structure, and doping of an impurity is eliminated. Here, "the metal oxide" is, for example, a hafnium oxide (HfO2), and "an impurity" is other element than the hafnium such as Zr (Hf), Si, Y, Sc, Ti, Ta, Mg, Ca, Ba, or lanthanoid.

A semiconductor device according to a sixth aspect of the invention includes a semiconductor substrate, a metal oxide formed on the semiconductor substrate, a first gate electrode film formed on the metal oxide, and a second gate electrode film formed on the first gate electrode film, the metal oxide has one of a cubic crystal structure, a tetragonal crystal structure, and an orthorhombic crystal structure, and doping of an impurity is eliminated.

According to the semiconductor device of above aspects of the invention, the gate insulating film is formed of the metal oxide having a cubic, tetragonal, or orthorhombic crystal structure, the gate insulating film has a high permittivity and small leakage current. Therefore, it can cope with further reduction of the thickness of the gate insulating film.

BRIEF DESCRIPTION OF THE DRAWINGS

The invention will now be described with reference to the accompanying drawings, wherein like numbers refer to like elements.

DESCRIPTION OF EXEMPLARY EMBODIMENTS

An embodiment of the invention will hereinafter be explained with reference to the accompanying drawings.

1. First Embodiment

FIGS. 1A through 1D are cross-sectional diagrams showing a method of manufacturing a semiconductor device according to the first embodiment of the invention.

Figure 1A:
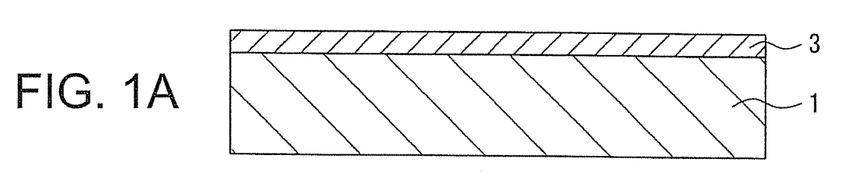
FIGS. 1A through 1D are cross-sectional diagrams showing a method of manufacturing a semiconductor device according to a first embodiment of the invention.

Firstly, as shown in FIG. 1A, a thin film 3 (hereinafter also referred to as an $HfO_2$ film) made of hafnium oxide ($HfO_2$) is formed on a silicon substrate 1. The method of forming the $HfO_2$ film 3 is, for example, a sputtering method or an atomic layer deposition (ALD) method, and the thickness of the film to be formed is, for example, 1 through 10 nm.

Figure 1B:
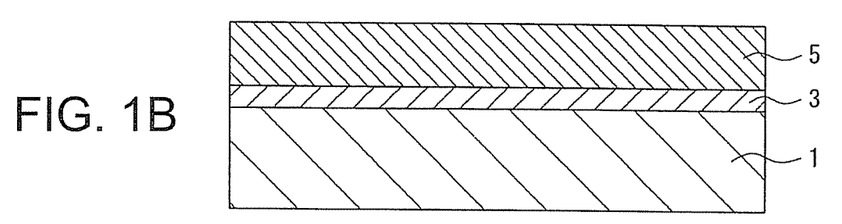

Subsequently, as shown in FIG. 1B, the gate electrode film 5 is formed on the $HfO_2$ film 3. As the material of the gate electrode film 5, a silicon film, a silicide film, metal nitride, metal carbide, or metal itself such as Si, NiSi, PtSi, $CoSi_2$, $TiSi_2$, TiN, TaN, VN, ZrN, HfN, ScN, TiC, TaC, VC, ZrC, HfC, ScC, W, Pt, or Ni can be used, and the gate electrode film 5 is formed by, for example, chemical vapor deposition (CVD) or sputtering. Here, as an example of the gate electrode film 5, a TiN film is formed to have a thickness of, for example, 10 through 100 nm.

Subsequently, a thermal treatment (annealing) is executed on the silicon substrate 1 provided with the $HfO_2$ film 3 and the gate electrode film 5 formed thereon, thus crystallizing the $HfO_2$ film 3. The thermal treatment for crystallization can sufficiently be executed in, for example, $N_2$ atmosphere in a temperature range of 400 through 1000° C., and preferably at temperature of 800° C. The temperature range of 400 through 1000° C. is based on a result of an experiment described later. Here, the thermal treatment of 800° C. is executed on the $HfO_2$ film 3, for example, under the $N_2$ atmosphere.

Figure 1C:
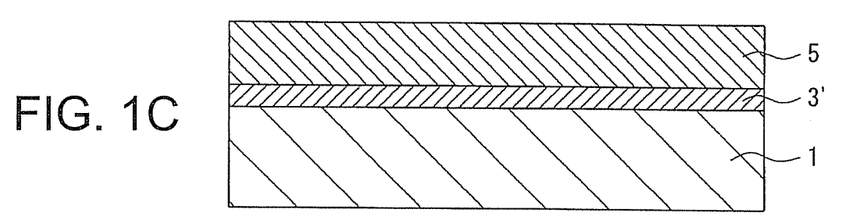
Figure 1D:
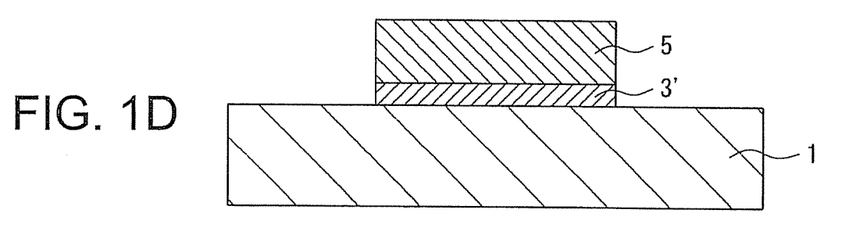

According to this process, as shown in FIG. 1C, the crystallized $HfO_2$ film 3' can be obtained. As will be understood from the result of the experiment described later, the $HfO_2$ film 3' has a cubic crystal structure. Thereafter, as shown in FIG. 1D, the gate electrode film 5 is patterned to have an electrode shape by photolithography and dry-etching technologies. The patterned gate electrode 5 becomes a gate electrode of a MOS device, and the $HfO_2$ film 3' under the gate electrode 5 becomes the gate insulating film of the MOS device.

As described above, according to the first embodiment of the invention, the $HfO_2$ film 3' having a cubic, tetragonal, or orthorhombic crystal structure can be obtained, and consequently, the $HfO_2$ film 3' having high permittivity and low leakage current can be used as the gate insulating film. Therefore, further reduction of the thickness of the gate insulating film becomes possible. Further, although the case in which the thermal treatment for crystallization is executed without doping Zr (Hf), Si, Y, Sc, Ti, Ta, Mg, Ca, Ba, lanthanoid, and so on (hereinafter also referred to as impurities) into the HfO$_2$ film 3 is explained in the first embodiment of the invention, according to the embodiment of the invention, it is possible to execute the thermal treatment with the above impurities doped into the HfO$_2$ film 3. According to the embodiment of the invention, the HfO$_2$ film 3' having a cubic, tetragonal, or orthorhombic crystal structure can stably be formed with or without doping of the impurities described above into the HfO$_2$ film 3.

In the first embodiment of the invention, the silicon substrate 1 corresponds to "a semiconductor substrate" of the invention, the HfO$_2$ film 3' corresponds to "a crystallized metal oxide" of the invention. Further, the gate electrode film 5 corresponds to "a gate electrode film" of the invention.

2. Second Embodiment

In the first embodiment described above, the case in which the gate electrode film is formed of a single layer is explained. However, the gate electrode film of the invention is not limited to the single layer structure, but can take a double layer structure. In the second embodiment of the invention, the case in which a double layer structure is adopted in the gate electrode film will be explained.

FIGS. 2A through 2D are cross-sectional diagrams showing a method of manufacturing a semiconductor device according to the second embodiment of the invention. In FIGS. 2A through 2D, the parts having the same configurations as in FIGS. 1A through 1D are provided with the same reference numerals, and detailed explanations therefor will be omitted.

Figure 2A:
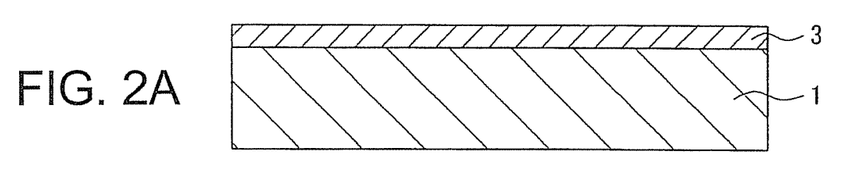
FIGS. 2A through 2D are cross-sectional diagrams showing a method of manufacturing a semiconductor device according to a second embodiment of the invention.
Figure 2B:
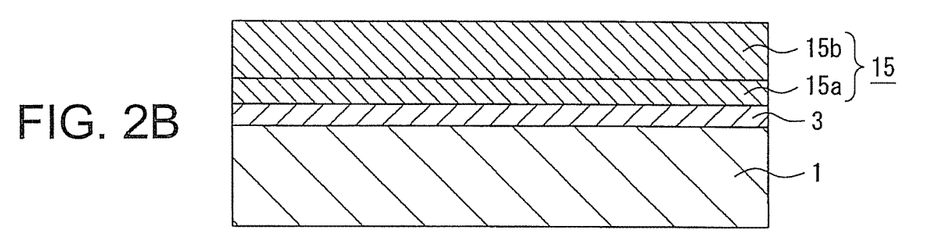

Firstly, as shown in FIG. 2A, the HfO$_2$ film 3 is formed on the silicon substrate 1. Subsequently, as shown in FIG. 2B, a first gate electrode film 15a is formed on the HfO$_2$ film 3. As the material of the first gate electrode film 15a, metal nitride, metal carbide, or metal itself such as TiN, TaN, VN, ZrN, HfN, ScN, TiC, TaC, VC, ZrC, HfC, ScC, W, Pt, or Ni can be used, and the first gate electrode film 15a is formed by, for example, CVD or sputtering. Here, as an example of the first gate electrode film 15a, a TiN film is formed to have a thickness of, for example, 1 through 100 nm.

Subsequently, a second gate electrode film 15b is formed on the first gate electrode film 15a. As the material of the second gate electrode film 15b, for example, Si or a silicide film such as NiSi, PtSi, CoSi$_2$, or TiSi$_2$ can be used, and the second gate electrode film 15b is formed by, for example, CVD or sputtering. Here, as an example of the second gate electrode film 15b, an NiSi film is formed to have a thickness of, for example, 10 through 200 nm.

As described above, by stacking the second gate electrode film 15b on the first gate electrode 15a, the gate electrode film 15 having a double layer structure is formed. Here, the first gate electrode film 15a has mainly two roles. The first role thereof is to influence the crystal structure of the HfO$_2$ film 3 to contribute to increase in permittivity of the HfO$_2$ film 3. Further, the second role is to prevent mutual dispersion of the constituent elements between the second gate electrode film 15b and the HfO$_2$ film 3. The first gate electrode film 15a functions as a barrier film against both of the element dispersion from the HfO$_2$ film 3 to the second gate electrode film 15b and the element dispersion from the second gate electrode film 15b to the HfO$_2$ film 3.

Subsequently, a thermal treatment (annealing) is executed on the silicon substrate 1 provided with the HfO$_2$ film 3 and the gate electrode film 15 formed thereon, thus crystallizing the HfO$_2$ film 3. Similarly to the first embodiment, the thermal treatment for crystallization can sufficiently be executed in, for example, N$_2$ atmosphere in a temperature range of 400 through 1000° C., and preferably at temperature of 800° C. Here, the thermal treatment of 800° C. is executed on the HfO$_2$ film 3, for example, under the N$_2$ atmosphere.

Figure 2C:
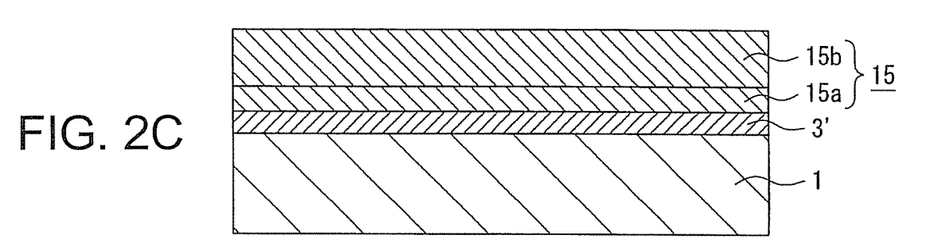
Figure 2D:
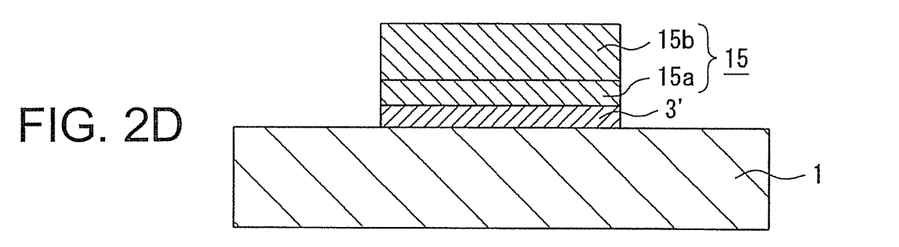

According to this process, as shown in FIG. 2C, the HfO$_2$ film 3' having a cubic crystal structure can be obtained. Thereafter, as shown in FIG. 2D, the gate electrode film 15 with a double layer structure is patterned to have an electrode shape by photolithography and dry-etching technologies. The patterned gate electrode 15 becomes a gate electrode of a MOS device, and the HfO$_2$ film 3' under the gate electrode 5 becomes the gate insulating film of the MOS device.

As described above, according to the second embodiment of the invention, similarly to the first embodiment, the HfO$_2$ film 3' having a cubic, tetragonal, or orthorhombic crystal structure can be obtained, and consequently, the HfO$_2$ film 3' having high permittivity and low leakage current can be used as the gate insulating film. Therefore, further reduction of the thickness of the gate insulating film becomes possible. Further, although also in the second embodiment, the thermal treatment is executed without doping the impurities such as Zr (Hf), Si, Y, Sc, Ti, Ta, Mg, Ca, Ba, lanthanoid into the HfO$_2$ film 3, according to the embodiment of the invention, the HfO$_2$ film 3 having a cubic, tetragonal, or orthorhombic crystal structure can stably be formed with or without doping of the impurities described above into the HfO$_2$ film 3.

In the second embodiment, the gate electrode film 15 corresponds to "a gate electrode film" of the invention. Further, the first gate electrode film 15a corresponds to "a first gate electrode film" of the invention, and the second gate electrode film 15b corresponds to "a second gate electrode film" of the invention. Other correspondences are the same as in the first embodiment.

It should be noted that in the second embodiment, the case in which the gate electrode 15 having a double layer structure is composed of the first gate electrode film 15a and the second gate electrode film 15b is explained. The material of the first gate electrode 15a is, for example, metal nitride, metal carbide, or metal itself, and the material of the second gate electrode 15b is, for example, a silicon film or a silicide film. These materials can be combined freely, and a) through h) below are combinations suitable for crystallization of the HfO$_2$ film.

TiN+silicide electrode such as TiN+Poly-Si, TiN+NiSi, or TiN+PtSi b) TaN+silicide electrode such as TaN+Poly-Si, TaN+NiSi, or TaN+PtSi c) TaC+silicide electrode such as TaC+Poly-Si, TaC+NiSi, or TaC+PtSi d) HfN+silicide electrode such as HfN+Poly-Si, HfN+NiSi, or HfN+PtSi e) ZrN+silicide electrode such as ZrN+Poly-Si, ZrN+NiSi, or ZrN+PtSi f) TiC+silicide electrode such as TiC+Poly-Si, TiC+NiSi, or TiC+PtSi g) HfC+silicide electrode such as HfC+Poly-Si, HfC+NiSi, or HfC+PtSi h) ZrC+silicide electrode such as ZrC+Poly-Si, ZrC+NiSi, or ZrC+PtSi

3. Third Embodiment

In the first and second embodiments described above, the case in which the gate electrode film is used as a capping layer for the thermal treatment is explained. However, in the invention, there is no need for using the gate electrode film as the capping layer, but other films can be used as the capping layer.

In the third embodiment of the invention, the case in which a protective film is used as the capping layer will be explained.

FIGS. 3A through 3E are cross-sectional diagrams showing a method of manufacturing a semiconductor device according to the third embodiment of the invention. In FIGS. 3A through 3E, the parts having the same configurations as in FIGS. 1A through 1D or FIGS. 2A through 2D are provided with the same reference numerals, and detailed explanations therefor will be omitted.

Figure 3A:
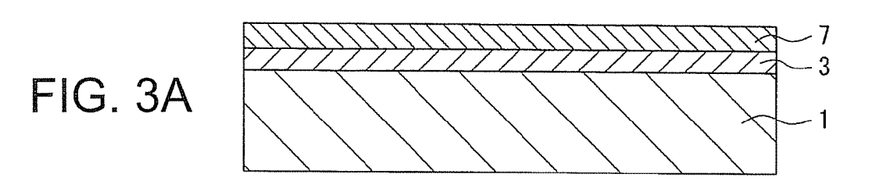
FIGS. 3A through 3E are cross-sectional diagrams showing a method of manufacturing a semiconductor device according to a third embodiment of the invention.

Firstly, as shown in FIG. 3A, the HfO$_2$ film 3 is formed on the silicon substrate.

Then, a protective film 7 is formed on the HfO$_2$ film 3. As the material of the protective film 7, the same material as the material of the gate electrode film, namely a silicon film, metal nitride, metal carbide, or metal itself such as Si, TiN, TaN, VN, ZrN, HfN, ScN, TiC, TaC, VC, ZrC, HfC, ScC, W, Pt, or Ni can be used, and the protective film 7 is formed by CVD or sputtering. Here, as an example of the protective film 7, a TiN film is formed to have a thickness of, for example, 10 through 100 nm.

It should be noted that the protective film 7 can have a multilayer structure including two or more layers instead of a single layer structure. In the case of a double layer structure, the same configuration as the gate electrode film 15 (i.e., a stacked structure composed of the first gate electrode film 15a and the second gate electrode film 15b) shown in FIG. 2 can, for example, be adopted. Further, the material of the protective film 7 is not limited to the materials for the gate electrode film, but can be other films.

Figure 3B:
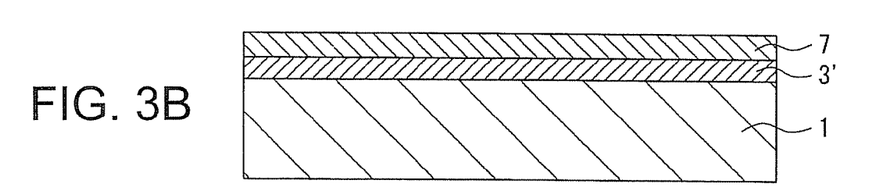

Subsequently, a thermal treatment (annealing) is executed on the silicon substrate 1 provided with the HfO$_2$ film 3 and the protective film 7 formed thereon, thus crystallizing the HfO$_2$ film 3. Similarly to the first and second embodiments, the thermal treatment for crystallization can sufficiently be executed in, for example, N$_2$ atmosphere in a temperature range of 400 through 1000° C., and preferably at temperature of 800° C. Here, the thermal treatment of 800° C. is executed on the HfO$_2$ film 3, for example, under the N$_2$ atmosphere. According to this process, as shown in FIG. 3B, the HfO$_2$ film 3' having a cubic crystal structure can be obtained.

Figure 3C:
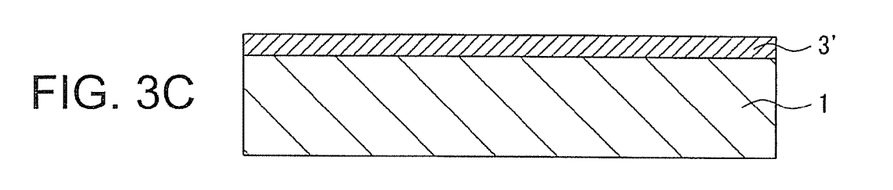

Subsequently, etching is executed on the protective film 7 to remove the protective film 7 from above the HfO$_2$ film 3', thus exposing the surface of the HfO$_2$ film 3' as shown in FIG. 3C. Although the removal of the protective film can be carried out by dry-etching, in order for preventing the etching damage to the HfO$_2$ film 3', the removal is more preferably executed by wet-etching than by dry-etching.

Figure 3D:
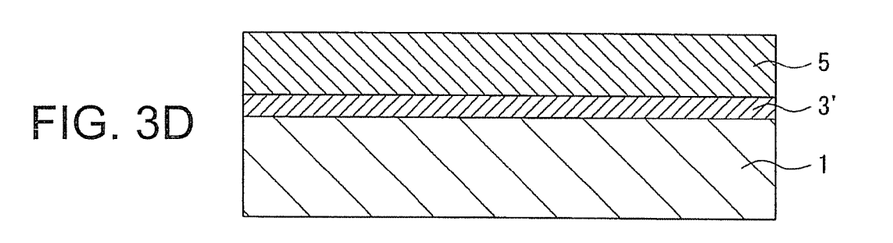
Figure 3E:
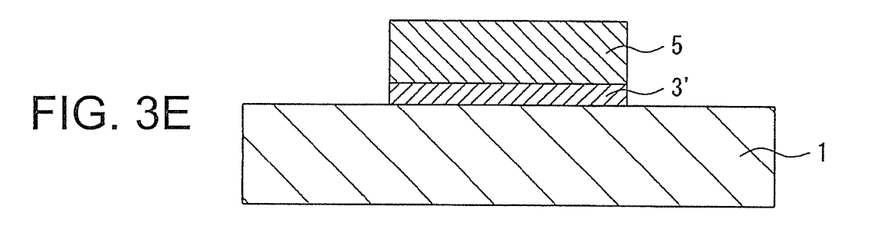

Subsequently, as shown in FIG. 3D, the gate electrode film 5 is formed on the HfO$_2$ film 3'. Further, it is possible to form the gate electrode film 15 (see FIG. 2) having a double layer structure on the HfO$_2$ film 3' instead of the gate electrode film 5 with a single layer structure. Thereafter, as shown in FIG. 3E, the gate electrode film 5 is patterned to have an electrode shape by photolithography and dry-etching technologies. The patterned gate electrode 5 becomes a gate electrode of a MOS device, and the HfO$_2$ film 3' under the gate electrode 5 becomes the gate insulating film of the MOS device.

As described above, according to the third embodiment of the invention, the HfO$_2$ film 3' having a cubic, tetragonal, or orthorhombic crystal structure can be obtained, and consequently, the same advantages as in the first and second embodiments can be obtained. Further, it can also be applied to this embodiment that the doping of the impurities such as Zr (Hf), Si, Y, Sc, Ti, Ta, Mg, Ca, Ba, lanthanoid into the HfO$_2$ film 3 can be executed or eliminated prior to the thermal treatment for crystallization. Further, according to the third embodiment of the invention, the protective film 7 is removed after the thermal treatment, and then the gate electrode film 5 is formed. Therefore, the protective film 7 and the gate electrode film 5 can be formed of different materials from each other, and it is possible to use a film suitable for crystallization of the HfO$_2$ film 3 for the protective film 7, and a film suitable for the device characteristics for the gate electrode film 5, respectively.

It should be noted that in the third embodiment described above, it is possible that after removing the protective film 7 by, for example, wet-etching, the thermal treatment is executed on the entire silicon substrate 1 including the HfO$_2$ film 3' (or lamp-annealing the surface of the HfO$_2$ film 3'), and then the gate electrode film 5 is formed on the HfO$_2$ film 3'. According to such a method, even in the case in which defect or unevenness exists on the surface of the HfO$_2$ film 3', the defect and the unevenness can be removed to planarize the surface, therefore the contribution to improvement in yield and reliability of the semiconductor device and stabilization of the device characteristics can be achieved.

In the third embodiment, the gate electrode film 5 or the gate electrode film 15 corresponds to "a gate electrode film" of the invention, and the protective film 7 corresponds to "a protective film" of the invention. Further, in the case in which the protective film 7 has a double layer structure, the structure is the same as that of the gate electrode film 15, and the first gate electrode film 15a corresponds to "a first protective film" of the invention, and the second gate electrode film 15b corresponds to "a second protective film" of the invention. Other correspondences are the same as in the first and second embodiments.

4. Fourth Embodiment

In the third embodiment described above, that fact that the protective film can have either a single layer structure or a double layer structure has been explained. In the third embodiment, in the case in which the protective film has a double layer structure, the surface of the HfO$_2$ film 3' should be exposed by completely removing these two layers after the crystallization. However, in the present embodiment of the invention, it is possible that a part of the protective film is kept remaining on the HfO$_2$ film 3', and the gate electrode film is formed over the part of the protective film. In the fourth embodiment, such a case will be explained.

FIGS. 4A through 4E are cross-sectional diagrams showing a method of manufacturing a semiconductor device according to the fourth embodiment of the invention. In FIGS. 4A through 4E, the parts having the same configurations as in FIGS. 1A through 1D, 2A through 2D, or 3A through 3E are provided with the same reference numerals, and detailed explanations therefor will be omitted.

Figure 4A:
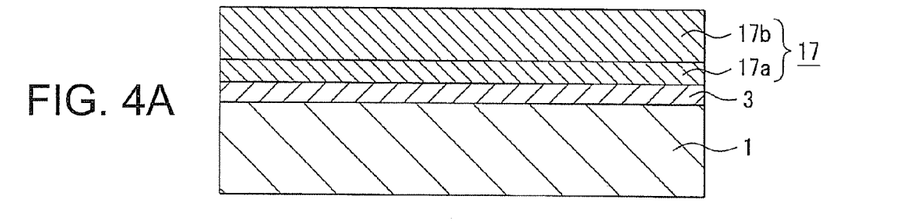
FIGS. 4A through 4E are cross-sectional diagrams showing a method of manufacturing a semiconductor device according to a fourth embodiment of the invention.

Firstly, as shown in FIG. 4A, the HfO$_2$ film 3 is formed on the silicon substrate 1. Then, a first protective film 17a is formed on the HfO$_2$ film 3, and further a second protective film 17b is formed thereon. As the first and second protective films 17a, 17b, any films can be used among materials for the gate electrode film such as Si, TiN, TaN, VN, ZrN, HfN, ScN, TiC, TaC, VC, ZrC, HfC, ScC, W, Pt, or Ni. It should be noted that it is required that the first protective film 17a and the second protective film 17b are formed of different materials from each other, and the kinds of material films are selected so that the etching selection ratio of the second protective film 17b becomes higher than that of the first protective film 17a (i.e., it becomes that the second protective film 17b is etched more easily than the first protective film 17a). Here, as an example of the first protective film 17a, a TiN film is formed to have a thickness of 1 through 100 nm, and as an example of the second protective film 17b, an Si film is formed to have a thickness of 10 through 200 nm.

Figure 4B:
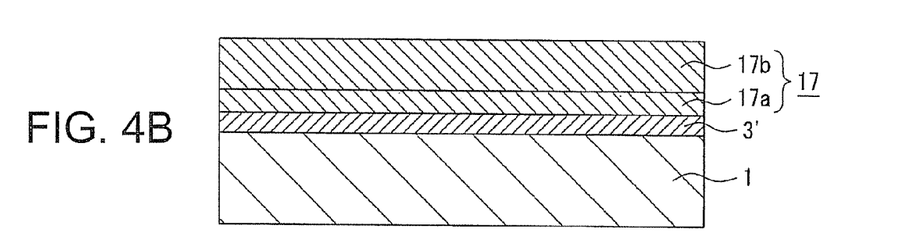

Subsequently, the thermal treatment (annealing) is executed on the silicon substrate 1 provided with the first protective film 17a and the second protective film 17b, thus crystallizing the $HfO_2$ film 3. Similarly to the first embodiment, the thermal treatment for crystallization can sufficiently be executed in, for example, $N_2$ atmosphere in a temperature range of 400° C. through 1000° C., and preferably at temperature of 800° C. Here, the thermal treatment of 800° C. is executed on the $HfO_2$ film 3, for example, under the $N_2$ atmosphere. According to this process, as shown in FIG. 4B, the $HfO_2$ film 4' having a cubic crystal structure can be obtained.

Figures 4C, 4D:
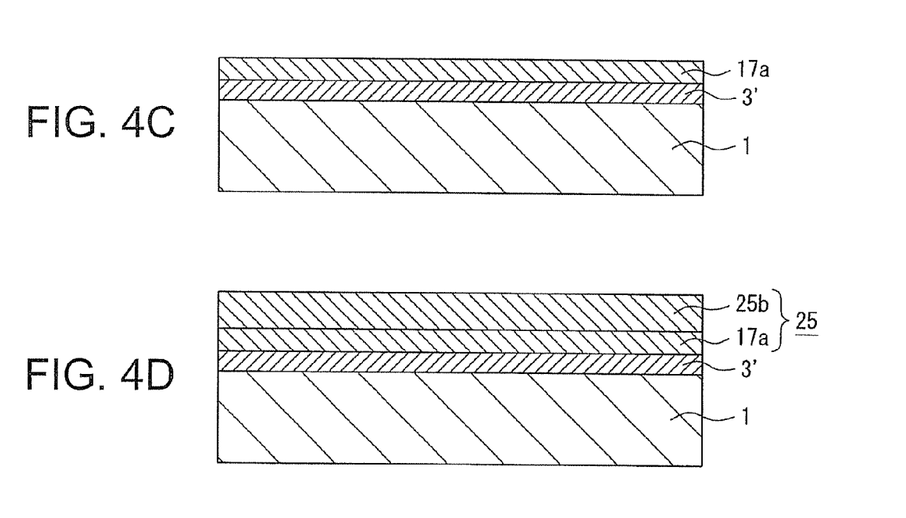

Subsequently, the second protective film 17b is removed by etching to expose the surface of the first protective film 17a. Here, since the second protective film 17b has a higher etching selection ratio than the first protective film 17a, the first protective film 17a should function as a etching stopper layer. Although the removal of the second protective film 17b can be carried out by dry-etching, in order for preventing the etching damage to the first protective film 17a and the $HfO_2$ film 3' disposed under the first protective film 17a, the removal is more preferably executed by wet-etching than by dry-etching.

Subsequently, as shown in FIG. 4D, the gate electrode film 25b is formed on the first protective film 17a. Here, as the gate electrode film 25b, metal nitride, metal carbide, or metal itself such as TiN, TaN, VN, ZrN, HfN, ScN, TiC, TaC, VC, ZrC, HfC, ScC, W, Pt, or Ni can be used. Further, Si or a silicide film such as NiSi, PtSi, CoSi2, TiSi2 can also be used. As the gate electrode film 25b, any material suitable for gate electrode film can be used in accordance with the desired device characteristics. The gate electrode film 25 with a double layer structure is composed of the gate electrode film 25b and the first protective layer 17a. Further, even in the same chip, different materials can be used for the gate electrode film 25b corresponding to the types of the transistors such as PMOS or NMOS.

Figure 4E:
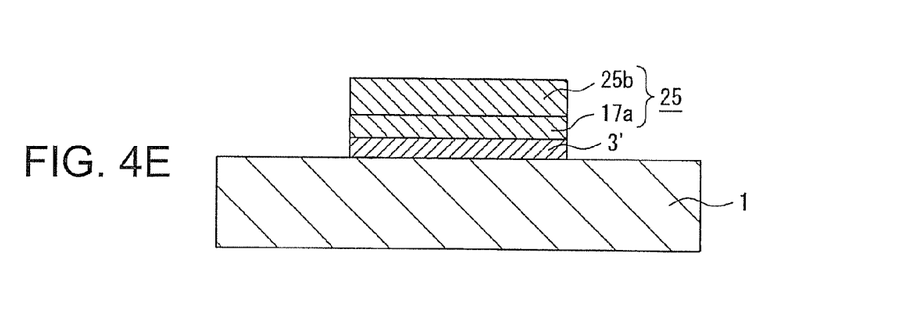

Thereafter, as shown in FIG. 4E, the gate electrode film 25 with a double layer structure is patterned to have an electrode shape by photolithography and dry-etching technologies. The patterned gate electrode 25 becomes a gate electrode of a MOS device, and the $HfO_2$ film 3' under the gate electrode 5 becomes the gate insulating film of the MOS device.

As described above, according to the fourth embodiment of the invention, the $HfO_2$ film 3' having a cubic, tetragonal, or orthorhombic crystal structure can be obtained, and consequently, the same advantages as in the first through third embodiments can be obtained. Further, it can also be applied to this embodiment that the doping of the impurities such as Zr (Hf), Si, Y, Sc, Ti, Ta, Mg, Ca, Ba, and lanthanoid into the $HfO_2$ film 3 can be executed or eliminated. Further, in comparison with the third embodiment, since it can be eliminated to expose the surface of the crystallized $HfO_2$ film 3', the problem such that foreign matters of impurities are attached to the interface between the $HfO_2$ film 3' and the gate electrode film 25 can be prevented.

In the fourth embodiment, the gate electrode film 25b corresponds to "a third gate electrode film" of the invention. Further, the first protective film 17a corresponds to "a first protective film" of the invention, and the second protective film 17b corresponds to "a second protective film" of the invention. Other correspondences are the same as in the first through third embodiments.

5. Results of the Experiments

Figure 5:
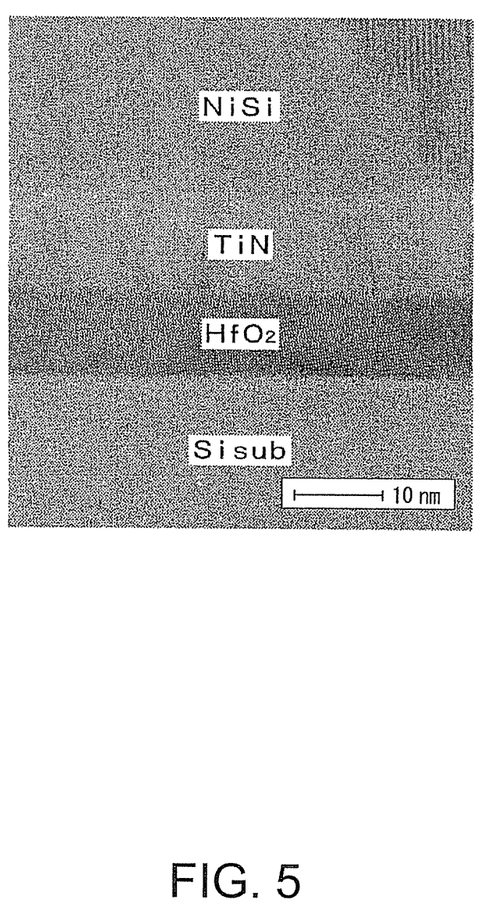
FIG. 5 is a diagram showing a result of cross-sectional observation with a TEM.

FIG. 5 is a diagram showing a result of cross-sectional observation with a transmission electron microscopy (TEM). This observation image shows a cross-sectional surface of an object obtained by stacking a hafnium oxide ($HfO_2$) film, a titanium nitride (TiN) film, and a nickel silicide (NiSi) film on the silicon substrate (Si sub), and then executing a thermal treatment (PGA) thereon at 800° C. As shown in FIG. 5, it proved that the $HfO_2$ film was crystallized. Further, the film thickness is estimated as 8.69 nm (8.76 nm). The numerical value 8.69 nm outside the parenthesis is an estimated value from the TEM image, and the numerical value 8.76 inside the parenthesis is an estimated value from the deposition rate of the film.

It should be noted that in FIG. 5, the TiN film and the NiSi film correspond to the gate electrode film of the MOS structure, and the $HfO_2$ film corresponds to the gate insulating film thereof. Therefore, in the following explanations, the thermal treatment executed after forming the gate electrode film is called post gate-electrode-deposition annealing (PGA), and the thermal treatment executed prior to the formation of the gate electrode film is called post deposition annealing (PDA). Both of the PGA and the PDA are the annealing treatments for improving the quality of the $HfO_2$ film.

Figure 6:
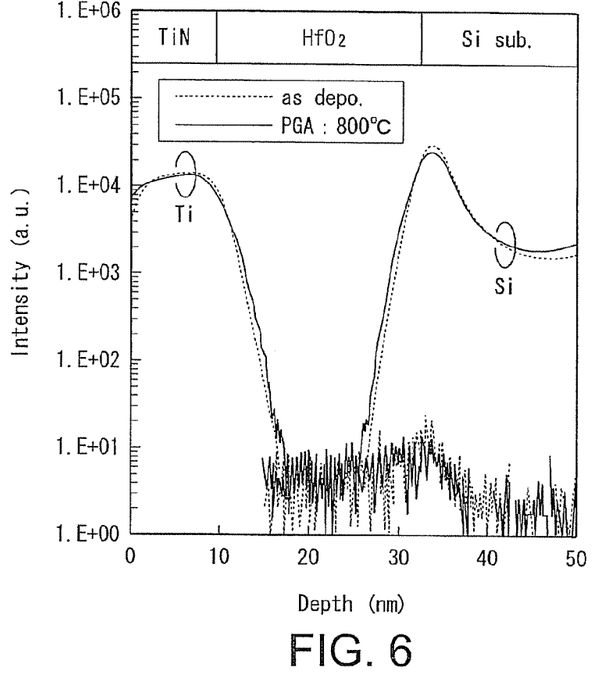
FIG. 6 is a diagram showing a result of measurement of a concentration profile with SIMS.

FIG. 6 is a diagram showing a result of measurement of concentration profiles of Ti and Si by a secondary ion mass spectroscopy (SIMS). The horizontal axis of FIG. 6 represents depth from the upper to the lower, and the vertical axis represents intensity. Further, the broken line in the drawing shows a result of analysis of an as-depo (i.e., prior to the thermal treatment) sample, and the solid line shows a result of analysis executed after execution of the PGA treatment at 800° C. These concentration profiles are results of measurement of the structure obtained by sequentially stacking the $HfO_2$ film, the TiN film, the Si film on the silicon substrate (Si sub), and the SIMS analysis was executed after removing Si in the outermost surface. As shown in FIG. 6, the profiles of Ti and Si do not change between before and after the thermal treatment at 800° C., and dispersion of Ti and Si into the $HfO_2$ film is not recognized. Thus, it was confirmed that the $HfO_2$ film kept the constituents pure after the thermal treatment at 800° C.

Figure 7:
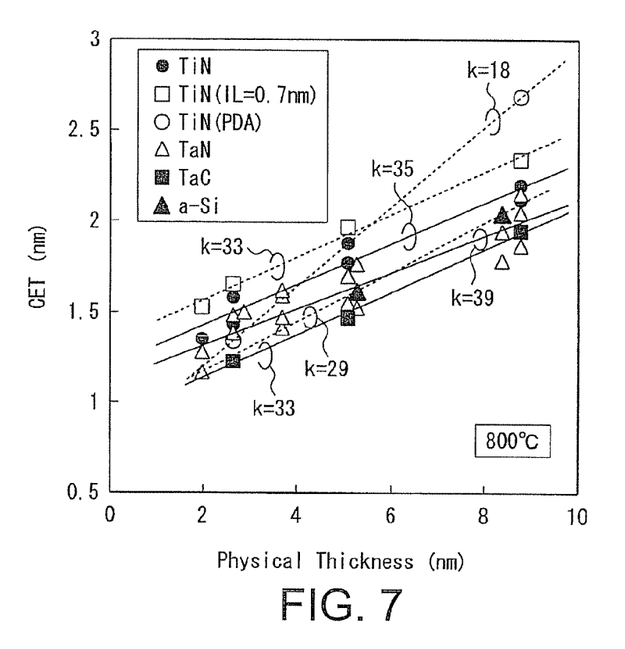
FIG. 7 is a diagram plotting the relationship between the thickness of an $HfO_2$ film and CET for every condition.

FIG. 7 is a diagram plotting the relationship between the thickness of the $HfO_2$ film and the CET for every type of the capping layer and difference in deposition condition. The horizontal axis of FIG. 7 represents physical thickness (hereinafter abbreviated as Tphys) of the $HfO_2$ film, and the vertical axis represents CET. Here, capacitance equivalent thickness (CET) denotes the oxide film equivalent thickness estimated from the capacitance. Further, Tphys can be reworded as deposition thickness, and is a value confirmed by X-ray reflectometry (XRR) and cross-sectional transmission electron microscopy (XTEM).

In FIG. 7, the symbol ● represents data of the sample on which the PGA treatment is executed after forming Si/TiN films on the $HfO_2$ film, and the symbol □ represents data of the sample on which the PGA treatment is executed after forming Si/TiN films on the $HfO_2$ film and further forming an inter layer (IL) of 0.7 nm thick between the silicon substrate (Si sub) and the $HfO_2$ film. Here, a silicon oxide film is formed as the IL.

Further, in FIG. 7, the symbol ○ represents data of the sample having the $HfO_2$ film on which the PDA treatment is executed and then Si/TiN films are deposited (i.e., method in the related art), and the symbol Δ represents data of the sample on which the PGA treatment is executed after Si/TaN films are formed on the $HfO_2$ film. Further, in FIG. 7, the symbol ■ represents data of the sample on which the PGA treatment is executed after forming Si/TaC films on the $HfO_2$ film, and the symbol ▲ represents data of the sample on which the PGA treatment is executed after forming an amorphous Si (a-Si) film on the $HfO_2$ film. Here, the TiN film, the TaN film, the TaC film, and the a-Si film each correspond to the capping layer. Further, the PDA treatment and the PGA treatment are each executed in $N_2$ atmosphere at temperature of 800° C.

In FIG. 7, the relative permittivity (k) of the $HfO_2$ film can be estimated from the gradient of the CET-Tphys plotting. In the case in which the Si/TiN films (the symbol of ●) are used as the capping layer, k=35 was obtained, and in the case with the Si/TaN films (the symbol of ∆), k=39 was obtained. Further, in the case with the PDA (the symbol of ○), the method in the related art, k=18 was obtained. According to this result, it proved that a higher k-value could be obtained by executing the PGA treatment in comparison with the case of executing the PDA treatment as the method in the related art. Further, it proved that in the case of executing the PGA treatment, the tendency to increase the k-value was the same even when the different capping layer was used, and k>30 was achieved except the case of using a-Si. Further, since the tendency to increase the k-value was kept in the case in which the IL was formed in the interface between the $HfO_2$ and Si, it proved that the condition of the Si substrate side hardly influenced the k-value.

Subsequently, in order for finding out the reason why the higher relative permittivity (the k-value) was obtained by the PGA treatment than by the PDA treatment, in the data shown in FIG. 7, the crystal structures of the samples, on which the PDA treatment and the PGA treatment were respectively executed, were analyzed with thin film X-ray diffraction spectroscopy (XRD).

Figure 8:
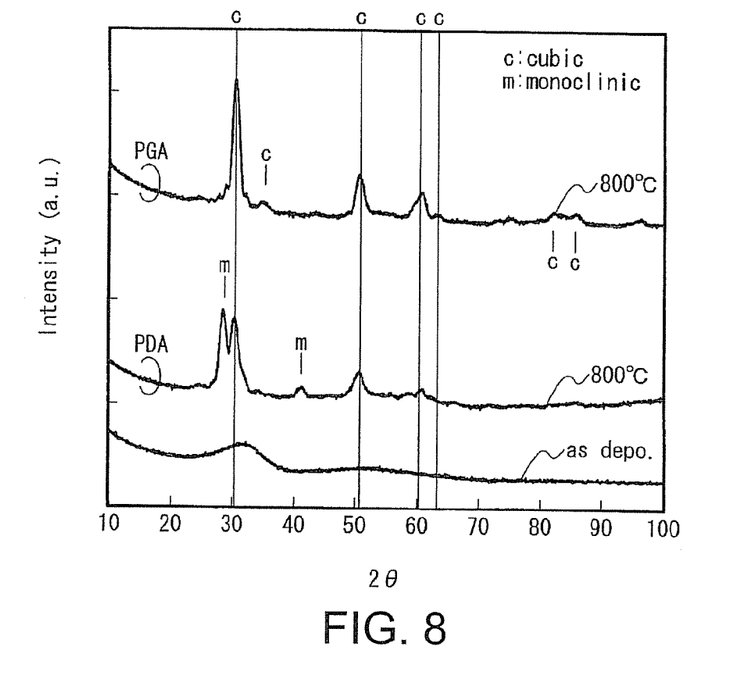
FIG. 8 is a diagram showing a result of analysis of the $HfO_2$ film with a thin film XRD.

FIG. 8 is diagram showing a result of analysis of the $HfO_2$ film (with the thermal treatment temperature of 800° C.) with the thin film XRD. The horizontal axis of FIG. 8 represents angle 2θ (θ represents the incident angle of the X-ray), and the vertical axis represents intensity. In FIG. 8, "PGA" denotes the $HfO_2$ film on which the PGA treatment is executed at temperature of 800° C., and "PDA" denotes the $HfO_2$ film on which the PDA treatment is executed at temperature of 800° C. Further, "as depo." denotes the $HfO_2$ film prior to execution of the thermal treatment. The capping layer covering the $HfO_2$ film in the PGA treatment was Si/TiN as shown in FIG. 5, and the capping layer was removed after the PGA treatment to execute the measurement.

As shown in FIG. 8, in the case with the $HfO_2$ film on which the PGA treatment was executed, a peak representing that the crystal structure thereof was mainly cubic appeared, and in the case with the $HfO_2$ film on which the PDA treatment was executed, a peak representing that the crystal structure thereof was mainly monoclinic appeared. According to such a result of the analysis, it proved that the crystal structure of the $HfO_2$ film became mainly cubic in the case in which the PGA treatment at 800° C. was executed thereon, while the crystal structure of the $HfO_2$ film became mainly monoclinic in the case in which the PDA treatment at 800° C. was executed thereon. In other words, by selecting the thermal treatment method at 800° C., the crystal structure of the $HfO_2$ film can be controlled. The reason therefor can be thought that the stress effect caused by the capping layer influences the crystallization condition of the $HfO_2$ film to cause difference in crystal structure. Further, from the data in FIGS. 7 and 8, it proved that the relative permittivity equal to or higher than 30 could be obtained by forming the $HfO_2$ film with the cubic crystal structure.

Figure 9:
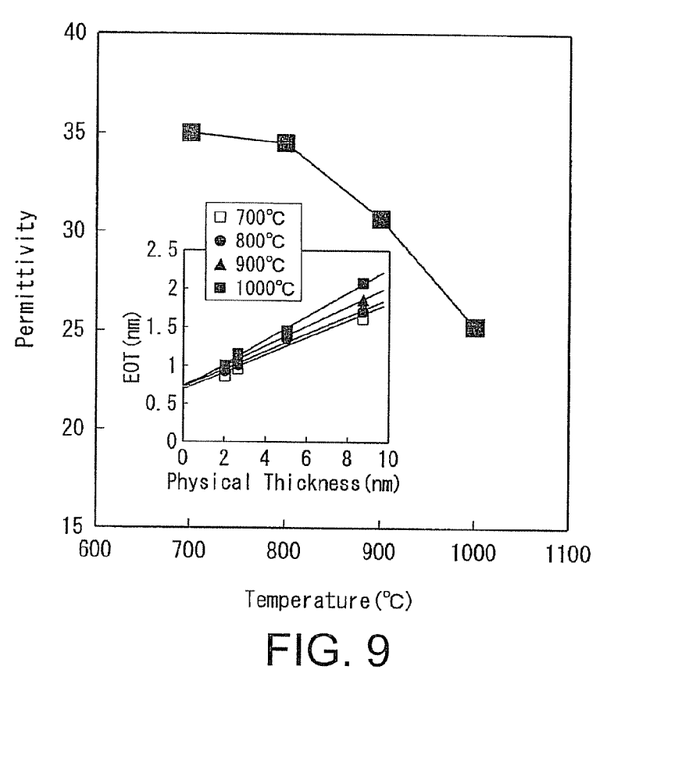
FIG. 9 is a diagram showing a relationship between annealing treatment temperature and the permittivity.

FIG. 9 is a diagram showing a relationship between annealing treatment temperature and the relative permittivity. The horizontal axis of FIG. 9 represents PGA treatment temperature, and the vertical axis represents relative permittivity. Further, the inserted diagram in FIG. 9 is a diagram plotting the relationship between the physical film thickness Tphys of the $HfO_2$ film on which the PGA treatment was executed and the EOT for every PGA treatment temperature. Equivalent oxide thickness (EOT) denotes the thickness reduced to that of the silicon oxide film. FIG. 9 and the inserted diagram therein show the data of the $HfO_2$ film on which the PGA treatment was executed using Si/TiN films as the capping layer. Further, in the inserted diagram, the symbol □ represents data of the PGA thermal treatment temperature of 700° C., the symbol ● represents data of the PGA thermal treatment temperature of 800° C., the symbol ▲ represents data of the PGA thermal treatment temperature of 900° C., and the symbol ■ represents data of the PGA thermal treatment temperature of 1000° C.

As shown in FIG. 9, although the relative permittivity is roughly 35 in the PGA treatment temperature range of 700° C. through 800° C., the relative permittivity decreases from that point as the treatment temperature rises, and the relative permittivity decreases to 25 at 1000° C. It should be noted that the relative permittivity represented in the vertical axis of FIG. 9 can be estimated from the gradient of the plotting of EOT-Tphys in, for example, the inserted diagram. The larger the gradient of the plotting is, the smaller value the relative permittivity becomes, and the gradient at 1000° C. is obviously larger compared to the gradient at 700° C. through 800° C. As described above, it proved that even in the cases in which the PGA treatments were executed similarly in the point that the Si/TiN films were used as the capping layer, the relative permittivity of the $HfO_2$ film varied in accordance with the treatment temperature, and there was a tendency to decrease the relative permittivity when the treatment temperature rose to 900° C. or higher. Further, the Y-intercept of the inserted diagram represents the thickness of the IL. Since the Y-intercept was substantially constant in each temperature in the range of 700° C. through 1000° C., it also proved that the thickness of the IL film did not vary even when the annealing temperature varied.

Subsequently, in order for finding out the reason why the relative permittivity (the k-value) decreases when the PGA treatment temperature rose above 900° C., in the data shown in FIG. 9, the crystal structures of the as-depo sample and the samples on which the PGA treatments at 600° C. through 1000° C. were executed, respectively, were analyzed with the thin film XRD.

Figure 10:
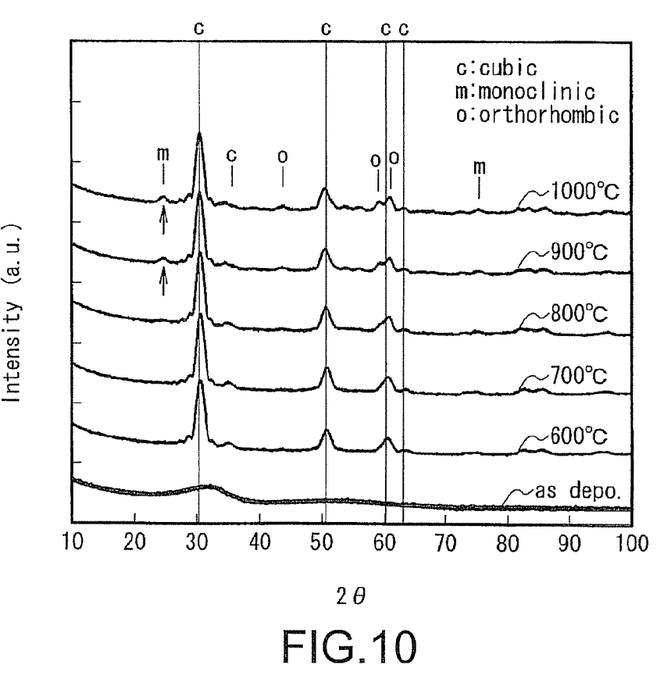
FIG. 10 is a diagram showing a result of analysis of the $HfO_2$ film with a thin film XRD.

FIG. 10 is a diagram showing a result of analysis of the $HfO_2$ films (with the PGA treatment temperature of 600° C. through 1000° C.) with the thin film XRD. The horizontal axis of FIG. 10 represents angle 2θ (θ represents the incident angle of the X-ray), and the vertical axis represents intensity. In FIG. 10, 600° C., 700° C., 800° C., 900° C., and 1000° C. each denote the PGA thermal treatment temperature. Further, "as depo." is a reference, and denotes the $HfO_2$ film prior to execution of the thermal treatment. Further, the capping layer covering the $HfO_2$ film in the PGA treatment was Si/TiN similarly to FIG. 8, and the capping layer was removed after the PGA treatment to execute the measurement.

As shown in FIG. 10, in the PGA treatment temperature range of 600° C. through 1000° C., sharp peaks representing that the $HfO_2$ films have the cubic crystal structures appear. However, as indicated with arrows in FIG. 10, in the area in which the PGA treatment temperature is equal to or higher than 900° C., a peak representing that the crystal structure of the $HfO_2$ film is monoclinic starts appearing. As described above, since in the case in which the PGA treatment temperature rises to 900° C. or higher, the monoclinic crystal structure appears in the HfO$_2$ film, it can be thought that the cause of the fact that the permittivity of the HfO$_2$ film decreases at temperature of 900° C. or higher is that the phase separation to the monoclinic crystal structure occurs in the crystal structure of the HfO$_2$ film.

Figure 11:
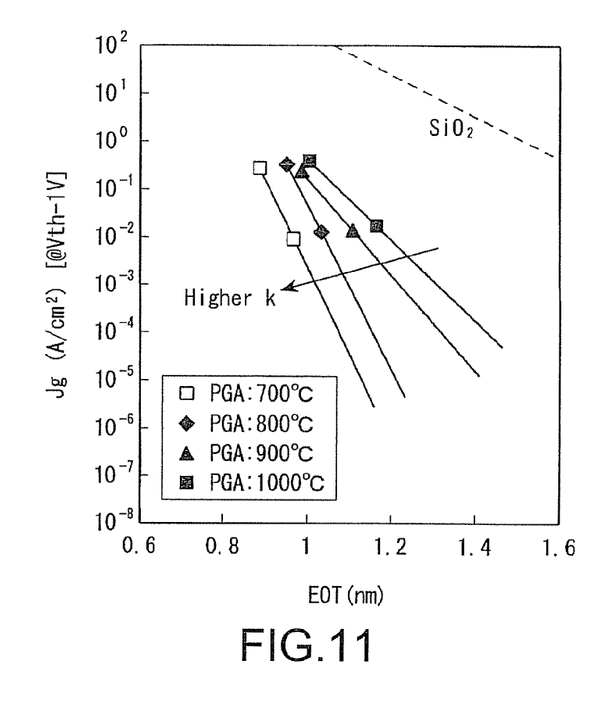
FIG. 11 is a diagram showing a relationship between EOT and the leakage current Jg.

FIG. 11 is a diagram showing a relationship between EOT and the leakage current Jg. The horizontal axis of FIG. 11 represents EOT of the MOS capacitor using the HfO$_2$ film as the gate insulating film, and the vertical axis represents the leakage current Jg (gate leakage current) in the same structure.

Further, in FIG. 11, the symbol □ represents data of the PGA treatment temperature of 700° C., the symbol ♦ represents data of the PGA treatment temperature of 800° C., the symbol ▲ represents data of the PGA treatment temperature of 900° C., and the symbol ■ represents data of the PGA treatment temperature of 1000° C. By performing comparison while varying the PGA treatment temperature from 700° C. to 1000° C., it proved that the leakage current Jg could be suppressed to a low level as the k-value increased (i.e., the PGA treatment temperature decreased). Further, it proved that in the vicinity of the EOT taking the value of 1 nm, roughly two digits of leakage merit could be obtained. The leakage current can be suppressed to a low level even with the HfO$_2$ film decreased in film thickness.

It should be noted that the relative permittivity of the cubic crystal structure shown in the result of the experiments described above is a larger value than ever reported. For example, some relative permittivity values (the k-values) of the HfO$_2$ film are described in FIG. 7, the values of k=29 through 39 are all larger than the theoretical value (k=29). In other words, although the relative permittivity of the HfO$_2$ film with a cubic crystal structure becomes 29 according to the theoretical calculation, the relative permittivity of the HfO$_2$ film with a cubic crystal structure in the invention becomes 29 through 39. Further, although not described in the specification, the value of k=49 was obtained in an experiment conducted by the inventors. In consideration of such a result of the experiment, it proved that according to the invention, the relative permittivity of the HfO$_2$ film with a cubic crystal structure could be increased to be larger than the theoretical value or the values ever reported.

What is claimed is:

1. A method of manufacturing a semiconductor device, comprising:
   forming a first metal oxide on a substrate, the substrate including a semiconductor material;
   forming a gate electrode on the first metal oxide; and
   after the forming of the gate electrode on the first metal oxide, crystallizing the first metal oxide to a second metal oxide by a thermal treatment,
   wherein the gate electrode includes a first gate electrode layer and a second gate electrode layer, the first gate electrode layer containing at least one of a metal nitride, vanadium carbide, silicon carbide, scandium carbide, and a metal itself, and the second gate electrode layer consisting of at least one of silicon and silicide, and
   the first gate electrode layer is formed to have a thickness in the range of 1 nm to 100 nm.

2. The method of manufacturing a semiconductor device according to claim 1, wherein the second metal oxide is a hafnium oxide film.

3. The method of manufacturing a semiconductor device according to claim 2, wherein temperature of the thermal treatment is in a range from 400° C. to 1000° C.

4. The method of claim 1, wherein the thermal treatment is conducted in an atmosphere consisting of N$_2$.

5. The method of claim 4, wherein the second metal oxide includes one of a cubic structure, a tetragonal structure, and an orthorhombic structure.

6. The method of claim 4, wherein the thermal treatment is conducted at a temperature of 800° C.

7. A method of manufacturing a semiconductor device, comprising:
   forming a first metal oxide on a substrate, the substrate including a semiconductor material;
   forming a protective layer on the first metal oxide; and
   after the forming of the protective layer on the first metal oxide, crystallizing the first metal oxide to a second metal oxide by a thermal treatment,
   wherein the protective layer includes a first protective film and a second protective film, the first protective film containing at least one of a metal nitride, vanadium carbide, silicon carbide, scandium carbide, and a metal itself, and the second protective film consisting of at least one of silicon and silicide.

8. The method of manufacturing a semiconductor device according to claim 7, wherein:
   the step of forming the protective layer includes:
      forming the first protective film on the first metal oxide; and
      forming the second protective film on the first protective film.

9. The method of manufacturing a semiconductor device according to claim 7, further comprising:
   removing the protective layer from above the second metal oxide crystallized in the thermal treatment; and
   forming a gate electrode film on the second metal oxide from which the protective film is removed.

10. The method of manufacturing a semiconductor device according to claim 9, wherein:
    the gate electrode film includes a first gate electrode film and a second gate electrode film; and
    the step of forming the gate electrode film includes:
       forming the first gate electrode film on the second metal oxide from which the protective film is removed; and
       forming the second gate electrode film on the first gate electrode film.

11. The method of manufacturing a semiconductor device according to claim 10, wherein:
    the first gate electrode film is formed of one of a metal oxide, a metal carbide, and a metal itself; and
    the second gate electrode film is one of a silicon film and a silicide film.

12. The method of claim 7, wherein the thermal treatment is conducted in an atmosphere consisting of N$_2$.

13. The method of claim 12, wherein the second metal oxide includes one of a cubic structure, a tetragonal structure, and an orthorhombic structure.

14. The method of claim 12, wherein the thermal treatment is conducted at a temperature of 800° C.

* * * * *